(12) United States Patent
Somasekhar et al.

(10) Patent No.: US 6,421,269 B1
(45) Date of Patent: Jul. 16, 2002

(54) LOW-LEAKAGE MOS PLANAR CAPACITORS FOR USE WITHIN DRAM STORAGE CELLS

(75) Inventors: Dinesh Somasekhar, Hillsboro; Shih-Lien L. Lu, Portland; Vivek K. De, Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/690,687

(22) Filed: Oct. 17, 2000

(51) Int. Cl.$^7$ .............................................. G11C 11/24

(52) U.S. Cl. ...................... 365/149; 365/145

(58) Field of Search ................................. 365/145, 149

(56) References Cited

U.S. PATENT DOCUMENTS 5,400,275 A * 3/1995 Abe et al. .................. 365/145

OTHER PUBLICATIONS

Itoh, K., "Trends in Megabit DRAM Circuit Design", *IEEE Journal of Solid–State Circuits*, 25 (3), pp. 778–789, (Jun. 1990).

* cited by examiner

Primary Examiner—M. Tran
(74) Attorney, Agent, or Firm—Blakely, Sokoloff, Taylor & Zafman LLP

(57) ABSTRACT

A planar capacitor for use within a dynamic random access memory (DRAM) cell is operated within semiconductor depletion during normal storage operations to increase the charge retention time of the capacitor. Operation within semiconductor depletion allows a significant increase in charge retention time in a capacitor for which gate oxide leakage is the predominant leakage mechanism. The voltages that are applied to the storage cell during DRAM operation are controlled so that the storage capacitor within the cell remains in depletion during storage of both a logic zero and a logic one. Although the capacitance of the cell is decreased by operating in depletion, the charge retention time of the cell can be increased by multiple orders of magnitude. In one application, the inventive structures and techniques are implemented within a DRAM device that is embedded within logic circuitry.

38 Claims, 4 Drawing Sheets

LOW-LEAKAGE MOS PLANAR CAPACITORS FOR USE WITHIN DRAM STORAGE CELLS

FIELD OF THE INVENTION

The invention relates generally to semiconductor storage devices and, more particularly, to capacitor structures for use therein.

BACKGROUND OF THE INVENTION

Dynamic random access memories (DRAM) are the semiconductor storage devices of choice for maximizing the number of data bits stored per unit surface area on a chip. A typical 1T DRAM cell includes only a single MOS access transistor and a corresponding storage capacitor. In contrast, a static RAM cell includes between 4 and 6 MOS devices. During DRAM cell operation, the storage capacitor holds one level of charge to represent a "logic one" and another level of charge to represent a "logic zero." The access transistor is used to controllably couple the storage capacitor to a bit line during read and/or write operations.

It is often desirable to embed DRAM storage devices within logic circuitry to provide high-density, on-chip storage capabilities for the logic circuitry. To embed such devices without requiring a change in the logic process, chip manufacturers commonly utilize the gate oxide layer of the logic transistors to provide the storage capacitors of the DRAM cells. The need for improving the performance of the logic transistors, however, has lead to a steady reduction in the thickness of the gate oxide layer used in logic circuits. Although this reduction in thickness provides an increased capacitance per unit surface area, it also results in an increase in gate-oxide leakage. Therefore, storage capacitors making use of these oxide layers typically display a decreased charge retention time, which is undesirable in a memory chip.

Therefore, there is a need for a method and apparatus for increasing the charge retention time of a DRAM storage capacitor having a relatively thin oxide layer.

DETAILED DESCRIPTION OF A PREFERRED EMBODIMENT

The present invention relates to planar semiconductor capacitor structures and methods for their use that are capable of achieving relatively high charge retention times while using relatively thin insulation layers between the gate and substrate. Instead of operating the capacitors in the inversion region as occurs in prior art devices, the capacitor structures are operated in semiconductor depletion. While this type of operation reduces the capacitance of the structures considerably, the retention time of the capacitors can be increased by multiple orders of magnitude. Thus, the structures are ideal for use within dynamic random access memory (DRAM) devices and other devices that benefit from enhanced charge retention time. The structures and techniques are particularly advantageous for use in DRAM devices that are embedded within logic circuitry that utilizes a thin oxide logic process so that the DRAM cells can be added with minimal change to the logic process.

Figure 1:
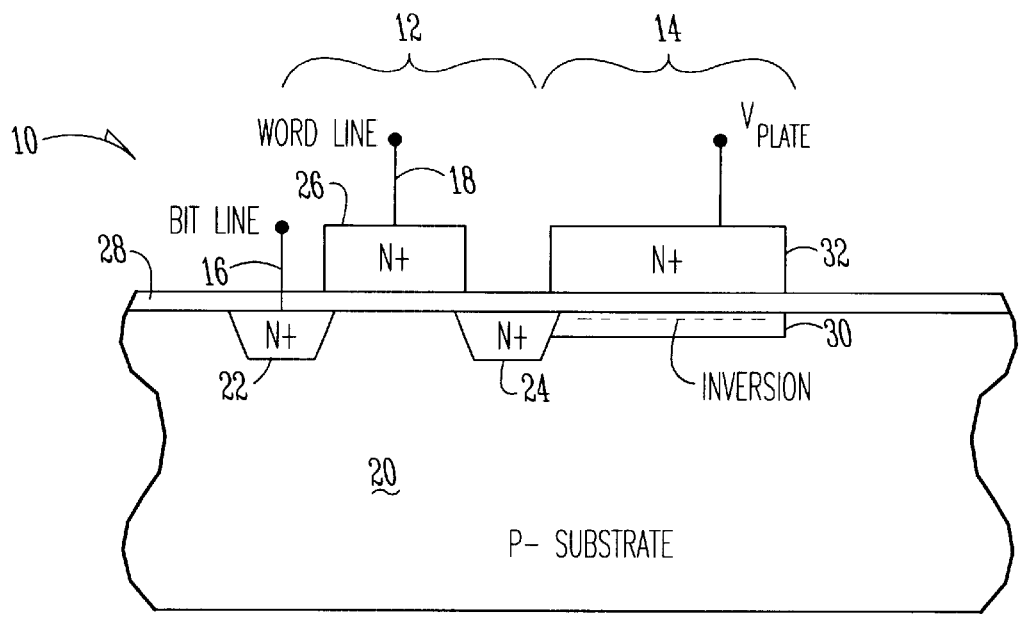
FIG. 1 is a side view illustrating a conventional dynamic random access memory (DRAM) cell for use in storing a single bit of digital data.

FIG. 1 is a side view illustrating a conventional DRAM cell 10 that is capable of storing a single bit of digital data. A typical DRAM memory device would include a large number of such cells for storing digital data within, for example, a computer system. As illustrated, the DRAM cell 10 includes an access transistor 12 and a storage capacitor 14. During read and write operations, the access transistor 12 is used as a switch to connect the storage capacitor 14 to a data-carrying bit line 16. The storage capacitor 14 is operative for storing an amount of electrical charge that is representative of the data value currently stored within the cell 10. For example, a "logic zero" is stored within the cell 10 if a first level of charge is stored within the storage capacitor 14 and a "logic one" is stored within the cell 10 if a second, different level of charge is stored within the storage capacitor 14. During a write operation, the access transistor 12 is turned on and a voltage is applied to the bit line 16 that causes the appropriate level of charge to be stored within the storage capacitor 14 for the data value being stored. During a read operation, the access transistor 12 is turned on and the charge stored within the storage capacitor 14 causes a predetermined signal response on the bit line 16 that is then sensed as either a "logic zero" or a "logic one" by sensing circuitry within the DRAM device.

As illustrated in FIG. 1, the access transistor 12 and the storage capacitor 14 are formed on a single semiconductor substrate 20. The access transistor 12 is a conventional insulated gate field effect transistor (IGFET) (e.g., a metal oxide semiconductor field effect transistor (MOSFET)) and the storage capacitor 14 is also an insulated gate structure. The access transistor 12 includes a conductive gate 26 that is conductively isolated from the substrate 20 by a thin insulation layer 28. The gate 26 of the access transistor 12 is conductively coupled to a word line 18 within the DRAM device. The access transistor 12 also includes a drain region 22 and a source region 24 within the substrate 20. The bit line 16 is conductively coupled to the drain region 22. To turn the access transistor 12 on and off, an appropriate voltage is applied to the word line 18. If the applied voltage exceeds a threshold value, charge inversion takes place within the substrate region below the gate 26 that electrically couples the drain and source regions 22, 24 (i.e., turns the access transistor 12 "on"). In the illustrated structure, the substrate 20 is lightly p doped and the drain and source regions 22, 24 are heavily n doped, forming an N channel transistor (e.g., NMOS). It should be appreciated that a P channel access transistor can alternatively be used (e.g., PMOS).

The storage capacitor 14 also includes a conductive gate 32 that is conductively isolated from the substrate 20 by the thin insulation layer 28. The conductive gate 32 of the storage capacitor 14 is coupled to a voltage source that maintains the gate 32 at a constant potential $V_{plate}$ during device operation. The voltage on the gate 32 generates a depletion region 30 in the area of the substrate 20 directly below the gate 32 that acts as a potential well capable of storing inversion charge. This depletion region 30 is electrically continuous with the source 24 of the access transistor 12 and can thus be filled with inversion charge by turning the access transistor 12 "on" and applying an appropriate voltage to the bit line 16. A first voltage level on the bit line 16 will fill the depletion region 30 with a first level of inversion charge (corresponding to, for example, a logic zero) and a second voltage level on the bit line 16 will fill the depletion region 30 with a second, different level of inversion charge (corresponding to, for example, a logic one). In an alternative capacitor structure, the substrate region below the gate 32 can be n doped. This will generally require a different plate voltage to be applied to the gate 32 during cell operation.

The insulation layer that is typically used in DRAM memory cells consists of an oxide layer that is formed on the surface of the semiconductor substrate using known techniques. Other possible insulation types include, for example, nitride, polymer, vacuum, and others. The semiconductor substrate is typically formed from silicon, but other semiconductive materials can also be used such as, for example, germanium. The conductive gates 26 and 32 will typically consist of an n type polysilicon material or a metallic material (e.g., aluminum) that adheres well to the insulation material.

Figure 2:
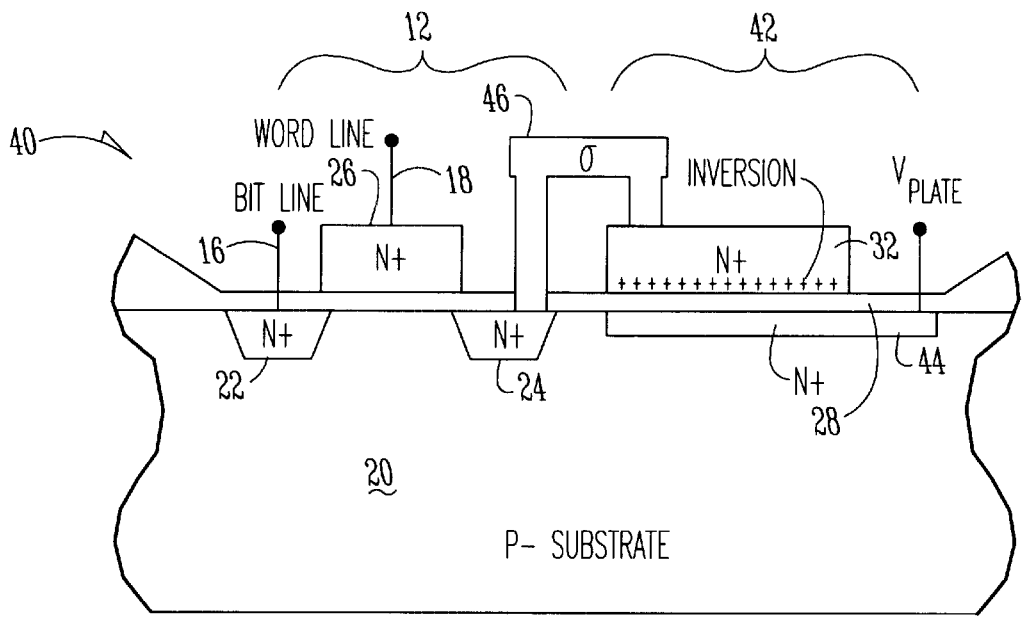
FIG. 2 is a side view illustrating a DRAM cell structure that has been used as an alternative to the cell structure illustrated in FIG. 1.

FIG. 2 is a side view illustrating a DRAM cell 40 that has been used as an alternative to the cell structure illustrated in FIG. 1. For purposes of convenience, the same reference numerals are used to identify elements in FIG. 2 that were used to identify the same or similar elements in FIG. 1. As illustrated, the cell 40 of FIG. 2 includes an access transistor 12 and a storage capacitor 42. As before, the storage capacitor 42 includes a conductive gate 32 that is separated from the substrate 20 by an insulating layer 28 and consists of a heavily doped n-type polysilicon. However, instead of being coupled to a voltage source, the conductive gate 32 of the storage capacitor 42 is conductively coupled to the source region 24 of the access transistor 12 using a conductive element 46. The conductive element 46 may consist of a metal or heavily doped semiconductor material. In one approach, a series of inter-layer vias and a metallization portion are used to make the connection between the source region 24 and the gate 32.

In addition to the above, a heavily n doped plate region 44 is formed within the substrate 20 of the cell 40, in a region below the gate 32. The plate region 44 is tied to a voltage source that keeps the plate region 44 at a relatively constant voltage $V_{plate}$. The voltage $V_{plate}$ on the plate region 44 causes a semiconductor depletion region to form within the gate 32 that is used to store inversion charge during device operation. That is, the inversion charge is not stored within the substrate 20 as in the previously described cell. The cell structure 40 of FIG. 2 is becoming popular for use within in embedded DRAM devices.

Figure 3:
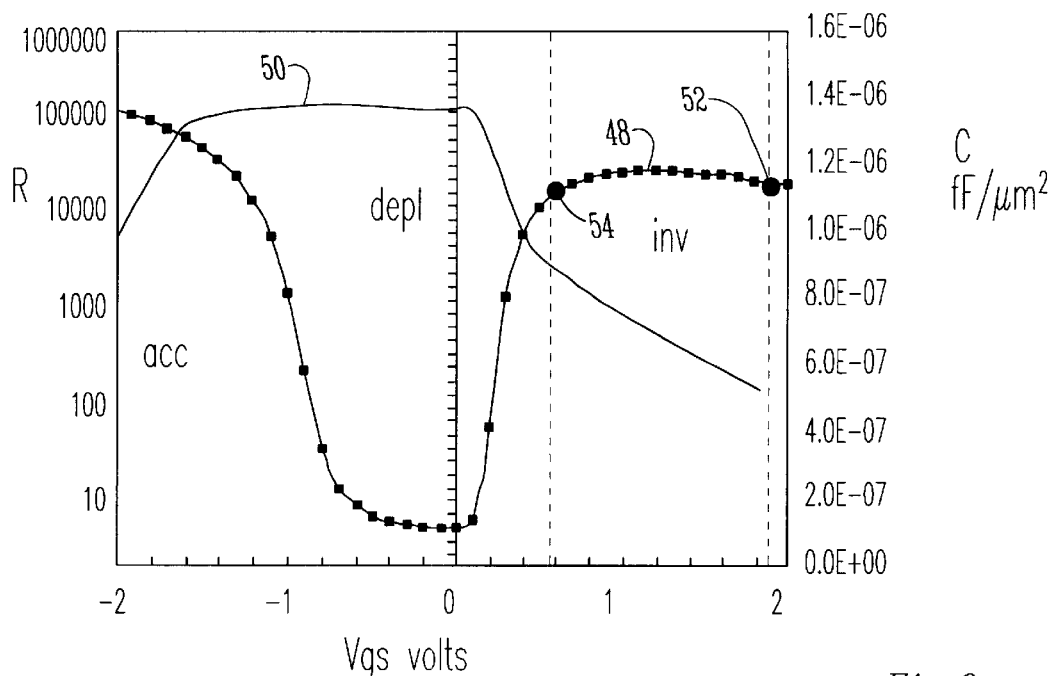
FIG. 3 is a graph illustrating a typical capacitance versus voltage characteristic and resistance versus voltage characteristic for the DRAM cell structures illustrated in FIGS. 1 and 2.

FIG. 3 is a graph illustrating a typical capacitance versus voltage characteristic 48 and resistance versus voltage characteristic 50 for the storage capacitor structures illustrated in FIGS. 1 and 2. As shown, the storage capacitors behave as voltage varying capacitors having three distinct operational regions; namely, the accumulation region, the depletion region, and the inversion region. The accumulation region is a region that is characterized by the accumulation of majority carriers within a semiconductor plate of the capacitor. The inversion region is characterized by the accumulation of minority carriers within a semiconductor plate of the capacitor. The depletion region is characterized by the lack of both majority and minority carriers within a semiconductor plate of the capacitor. The region of operation of the capacitor at any particular time depends upon the physical structure of the capacitor and the voltages applied thereto. As discussed above, prior art DRAM cell capacitor structures operate within the semiconductor inversion region to store information. For example, with reference to FIG. 3, a first voltage 52 within the inversion region is used to store a logic one and a second voltage 54 within the inversion region is used to store a logic zero.

The resistance versus voltage characteristic 50 of FIG. 3 illustrates the electrical resistance through the corresponding capacitor structure in each of the three operational regions. Ideally, if the insulation region were perfect, the resistance between the plates would be infinite. However, as illustrated, a finite resistance exists between the plates of the capacitor as a certain amount of leakage exists through the insulation layer. In addition, as shown, the resistance decreases rapidly (i.e., the leakage increases rapidly) as the inversion region of operation is entered. This rapid decrease in resistance gets even more pronounced as the thickness of the insulation layer decreases. High leakage capacitors are undesirable because the charge retention time of the capacitors is low. Thus, the capacitors have to be refreshed more often during DRAM cell operation.

In conceiving the present invention, it was appreciated that the depletion region of operation generates significantly lower leakage levels than does the inversion region of operation. Thus, even though depletion region operation results in capacitances that are typically 2–10 times lower than corresponding inversion region capacitances, such operation can reduce leakage by 2 orders of magnitude or more. Therefore, it was noted that capacitor structures that operate within the depletion region may have significantly longer charge retention times than capacitors that operate within the inversion region for the same insulation layer thickness. The charge retention time of a storage capacitor is proportional to $C_s/(I_{gate}+I_{leak})$, where $C_s$ is the storage cell capacitance, $I_{gate}$ is the gate leakage current through the insulation layer, and $I_{leak}$ is the leakage current through subthreshold and junction leakage mechanisms. Depletion region operation can thus be used to significantly improve charge retention times in devices where gate leakage is the dominant leakage factor. This is typically the case in devices using thin insulation layers (e.g., thin oxide layers).

Figure 4:
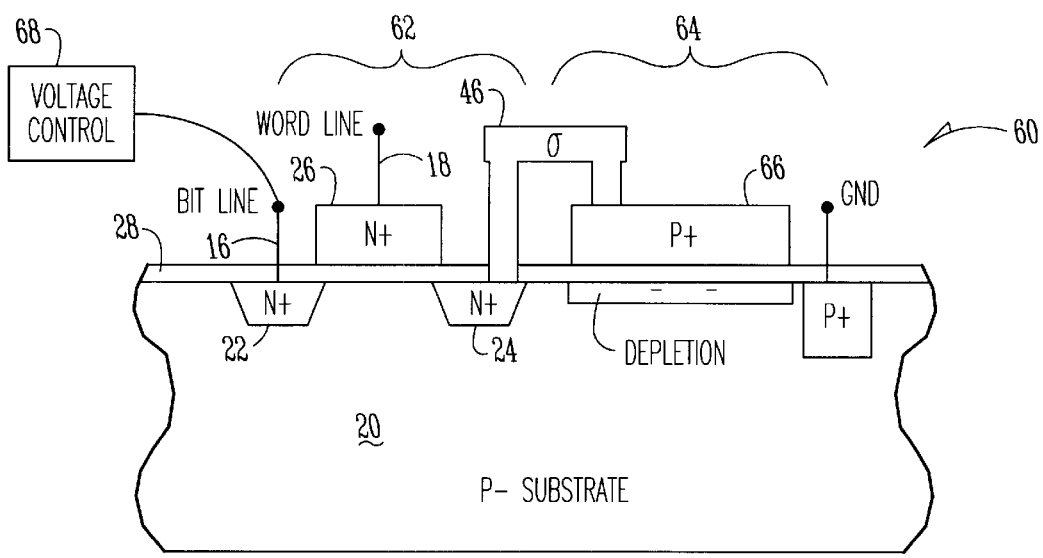
FIG. 4 is a side view illustrating a DRAM cell in accordance with one embodiment of the present invention.

FIG. 4 is a side view illustrating a DRAM cell 60 in accordance with one embodiment of the present invention. The illustrated structure has been determined to provide enhanced storage operation within the depletion region of operation over other possible structures. As illustrated, the DRAM cell 60 includes an access transistor 62 that is coupled to a storage capacitor 64, as in the cell of FIG. 2. However, the conductive gate 66 of the storage capacitor 64 consists of p doped polysilicon, rather than n doped polysilicon. The use of p doped polysilicon for the gate of the capacitor 64 has been found to facilitate operation within the depletion region as opposed to n doped polysilicon which is more likely to cause operation within the inversion region. In addition, the substrate 20 of the cell 60 is held at $V_{ss}$ (which is typically zero volts) rather than the plate voltage described earlier.

Figure 5:
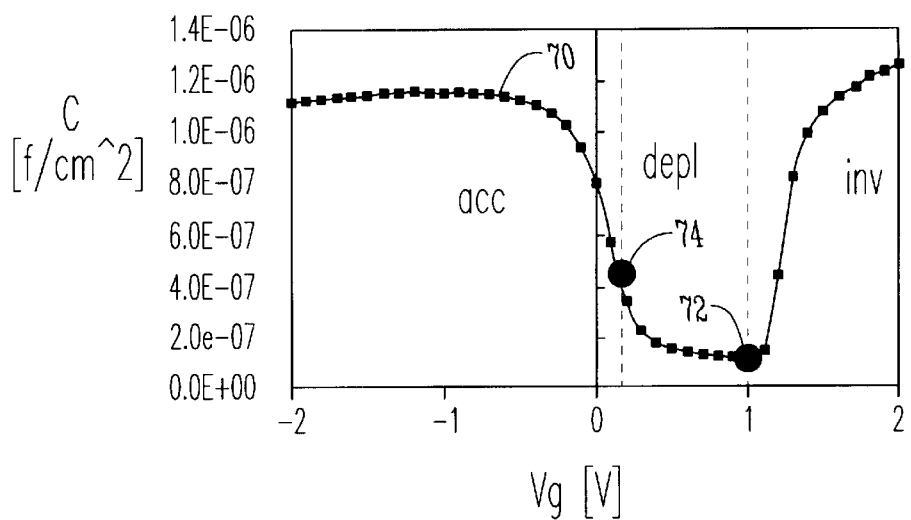
FIG. 5 is a graph illustrating the capacitance versus voltage characteristic of the cell structure of FIG. 4.

FIG. 5 is a graph illustrating the capacitance versus voltage characteristic 70 of the cell structure 60 of FIG. 4. As shown, instead of operating the cell within the inversion region as before, the cell is operated within the depletion region of operation. That is, a first voltage 72 within the depletion region is used to store a logic one and a second voltage 74 within the depletion region is used to store a logic zero. It is very important that the voltages be appropriately controlled during cell operation so that inversion, and the corresponding decrease in retention time, does not occur within the storage capacitor 64. In one approach, as illustrated in FIG. 4, a voltage control unit 68 is provided to ensure that the voltages applied to the bit line 16 during write operations are within prescribed ranges.

Figure 6:
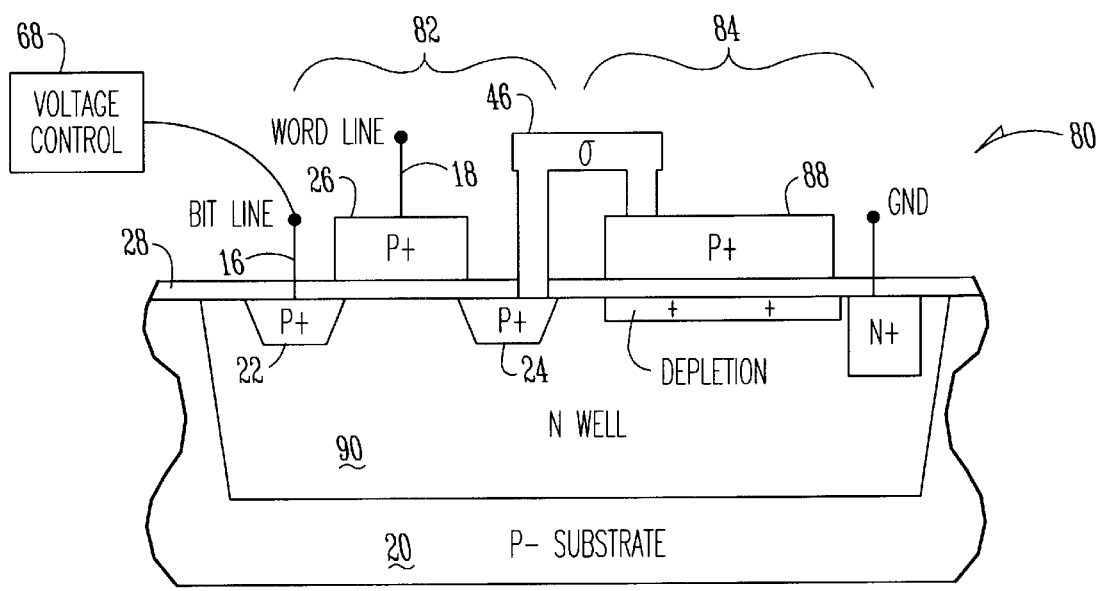
FIG. 6 is a side view illustrating a DRAM cell in accordance with another embodiment of the present invention.
Figure 7:
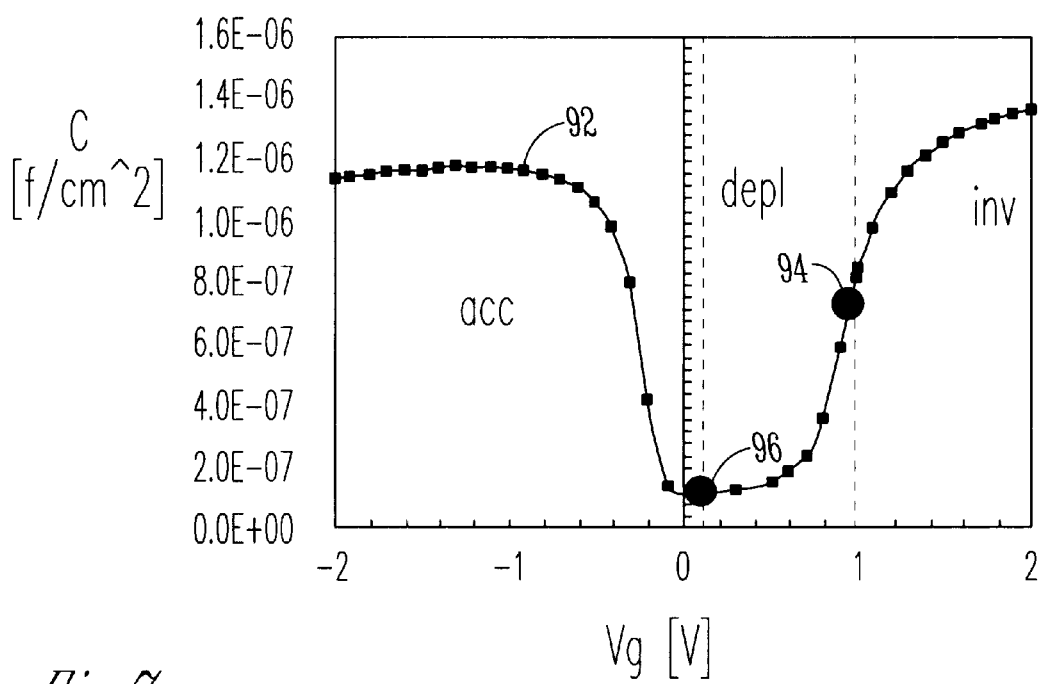
FIG. 7 is a graph illustrating the capacitance versus voltage characteristic of the cell structure of FIG. 6.

FIG. 6 is a side view illustrating a DRAM cell 80 in accordance with another embodiment of the present invention. This structure has also been determined to provide enhanced storage operation within the depletion region of operation. As illustrated, the DRAM cell 80 includes an access transistor 82 that is coupled to a storage capacitor 84. The access transistor 82 is a p-channel (e.g., PMOS) device that includes p+ doped source and drain regions 22, 24 within an n well 90 (or n doped substrate) and a p+ doped polysilicon gate 26. The n well is held at $V_{ss}$, which is typically zero volts, rather than supply. The storage capacitor 84 also includes a p+ doped polysilicon gate 88 and, consequently, does not require an additional doping step as does the structure of FIG. 4. FIG. 7 is a graph illustrating the capacitance versus voltage characteristic 92 of the cell structure 80 of FIG. 6. As shown, the characteristic 92 of FIG. 7 is similar to the characteristic 70 of FIG. 5. The curve appears inverted because a p channel cell is being implemented rather than an n channel cell. As before, a first voltage 94 within the depletion region is used to store a logic one and a second voltage 96 within the depletion region is used to store a logic zero. Again, relatively tight control of the voltages is needed to prevent entry into the inversion region. The cell structure 80 of FIG. 6 will generally require slightly more surface area on a chip than the cell structure 60 of FIG. 4 due to the presence of the n well 90. It should be appreciated that the inventive principles can be implemented using capacitor structures other than those illustrated in FIGS. 4 and 6 by appropriately controlling applied voltages during data storage operations.

One benefit of the present invention is that a DRAM device implementing the principles of the present invention can be embedded within logic on a semiconductor chip with minimal impact on the logic process. For example, the same insulation layer (e.g., oxide layer) that is used for the logic transistors can be used as the insulation layer for the storage capacitors of the DRAM cells. The trend is to make these insulation layers increasingly thin to enhance the performance of the logic. However, as described above, the thinner insulation layers reduce the retention time of the DRAM cells. The inventive structures and techniques allow increased retention times to be achieved with these thinner insulation layers.

Although the present invention has been described in conjunction with its preferred embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A dynamic random access memory (DRAM) device, comprising:
   a semiconductor substrate;
   a bit line on said semiconductor substrate; and
   a memory cell on said semiconductor substrate and coupled to said bit line, said memory cell comprising:
      a storage capacitor having a conductive gate that is separated from said semiconductor substrate by an insulation layer; and
      an access transistor to conductively couple said storage capacitor to said bit line in response to a control signal;
      wherein said storage capacitor is operated in semiconductor depletion during normal storage operations within said DRAM device.

2. The DRAM device claimed in claim 1, wherein:
said semiconductor substrate includes a first region located below said conductive gate of said storage capacitor on an opposite side of said insulation layer, said first region remaining substantially depleted of majority and minority carriers during storage of a logic one bit within said memory cell.

3. The DRAM device claimed in claim 2, wherein:
said first region of said semiconductor substrate remains substantially depleted of majority and minority carriers during storage of a logic zero bit within said memory cell.

4. The DRAM device claimed in claim 1, wherein:
said conductive gate of said storage capacitor is comprised of polysilicon that is heavily doped with a p type impurity.

5. The DRAM device claimed in claim 4, wherein:
said semiconductor substrate is held at $V_{ss}$ during DRAM operation.

6. The DRAM device claimed in claim 4, wherein:
said access transistor is an n channel device.

7. The DRAM device claimed in claim 4, wherein:
said access transistor is a p channel device.

8. The DRAM device claimed in claim 4, wherein:
said semiconductor substrate includes an n type well in an area below said storage capacitor.

9. The DRAM device claimed in claim 8, wherein:
said n type well is held at $V_{ss}$ during DRAM operation.

10. The DRAM device claimed in claim 1, comprising:
a voltage source coupled to said bit line to apply an appropriate voltage to said bit line during a write operation involving said memory cell, said voltage source placing a voltage within a first range on said bit line to write a logic one to said memory cell and a voltage within a second range on said bit line to write a logic zero to said memory cell, wherein said first and second voltage ranges are selected so that said storage capacitor remains substantially depleted of inversion charge during DRAM storage operations.

11. The DRAM device claimed in claim 1, wherein:
said access transistor is conductively coupled to said conductive gate of said storage capacitor.

12. A semiconductor logic chip comprising:
a semiconductor substrate;
logic circuitry on said semiconductor substrate; and
a dynamic random access memory (DRAM) device on said semiconductor substrate and coupled to said logic circuitry to provide data storage capabilities to said logic circuitry, said DRAM device comprising:
   a bit line on said semiconductor substrate; and
   a memory cell comprising:
      a storage capacitor having a conductive gate that is separated from said semiconductor substrate by an insulation layer; and an access transistor to conductively couple said storage capacitor to said bit line, in response to a control signal;

wherein said storage capacitor is operated in semiconductor depletion during normal storage operations within said DRAM device.

13. The semiconductor logic chip claimed in claim 12, wherein:

said logic circuitry includes a plurality of logic transistors that each include a conductive gate electrode that is separated from said semiconductor substrate by a thin insulation layer, wherein said insulation layer of said storage capacitor is approximately the same thickness as said thin insulation layers of said plurality of logic transistors.

14. The semiconductor logic chip claimed in claim 13, wherein:

said insulation layer of said storage capacitor and said insulation layers of said plurality of logic transistors are formed from a single oxide layer disposed upon said semiconductor substrate during chip manufacture.

15. A dynamic random access memory (DRAM) device comprising:

a planar storage capacitor including a conductive gate electrode that is separated from a semiconductor substrate by an insulation layer, said planar storage capacitor to store charge in an amount representative of a stored data value; and a voltage control unit to control a voltage between said conductive gate electrode of said planar storage capacitor and said semiconductor substrate during a write operation so that said planar storage capacitor remains within semiconductor depletion.

16. The DRAM device claimed in claim 15, comprising:

an access transistor coupled to said planar storage capacitor and said voltage control unit to conductively couple said planar storage capacitor to said voltage control unit during said write operation.

17. The DRAM device claimed in claim 15, wherein:

said conductive gate electrode includes p+ doped polysilicon and said semiconductor substrate is held at $V_{ss}$ during device operation.

18. The DRAM device claimed in claim 17, wherein:

said semiconductor substrate is held at a ground potential during device operation.

19. A memory comprising:

a storage capacitor having a conductive gate that is separated from a semiconductor substrate by an insulation layer; and an access transistor to conductively couple said storage capacitor to a bit line in response to a control signal, said storage capacitor and said access transistor forming a memory cell within said memory to store a digital data bit;

wherein said storage capacitor is operated in a semiconductor depletion region when said memory cell holds a logic one bit and when said memory cell holds a logic zero bit.

20. The memory of claim 19, wherein:

said conductive gate of said storage capacitor is comprised of p-type polysilicon.

21. The memory of claim 20, wherein:

said conductive gate of said storage capacitor is directly conductively coupled to a source region of said access transistor.

22. The memory of claim 21, wherein:

said semiconductor substrate is doped with a p-type impurity and is held at $V_{ss}$ during operation of said memory.

23. The memory of claim 22, wherein:

said access transistor is an NMOS device.

24. The memory of claim 21, wherein:

said semiconductor substrate is doped with a p-type material and includes an n-type well that encompasses both the access transistor and the storage capacitor, wherein the n-type well is held at $V_{ss}$ during operation of said memory.

25. The memory of claim 24, wherein:

said access transistor is a PMOS device.

26. A method for operating a semiconductor memory, comprising:

applying a first voltage to a storage capacitor within a memory cell when a logic one bit is being written to the memory cell; and applying a second voltage to the storage capacitor when a logic zero bit is being written to the memory cell;

wherein the first voltage and the second voltage each cause the storage capacitor to operate within a depletion region when applied to the storage capacitor.

27. The method of claim 26, wherein:

said storage capacitor includes a conductive gate separated from a semiconductor substrate by an insulation layer.

28. The method of claim 27, wherein:

applying a first voltage includes applying a first electric potential to said conductive gate of said storage capacitor, wherein said semiconductor substrate is held at a ground potential.

29. The method of claim 27, wherein:

applying a first voltage includes applying a first electric potential to said conductive gate of said storage capacitor, wherein said semiconductor substrate includes an n-type well in a region below said conductive gate that is held at a ground potential.

30. The method of claim 27, wherein:

said conductive gate is comprised of a polysilicon material that is heavily doped with a p type impurity.

31. A semiconductor logic chip comprising:

logic circuitry; and a memory cell to provide storage for the logic circuitry, said memory cell comprising:
  a storage capacitor; and
  an access transistor to controllably couple said storage capacitor to a bit line;

wherein said storage capacitor is operated in a semiconductor depletion region when a logic one data bit is stored in said memory cell and when a logic zero data bit is stored in said memory cell.

32. The semiconductor logic chip of claim 31, wherein:

said storage capacitor includes a conductive gate electrode that is separated from a semiconductor substrate by an insulation layer.

33. The semiconductor logic chip of claim 32, wherein:

said logic circuitry includes a plurality of logic transistors that each include a conductive gate electrode that is separated from the semiconductor substrate by an insulation layer, wherein said insulation layer of said storage capacitor is approximately the same thickness as said insulation layer of said plurality of logic transistors.

34. The semiconductor logic chip of claim 33, wherein:

said insulation layer of said storage capacitor and said insulation layer of said plurality of logic transistors are formed from a single oxide layer disposed upon said semiconductor substrate during chip manufacture.

35. A memory comprising:

a planar storage capacitor including a conductive gate electrode that is separated from a semiconductor substrate by an insulation layer, said planar storage capacitor to store charge in an amount representative of a stored data value; and a voltage controller to control a voltage across the planar storage capacitor during a write operation so that said planar storage capacitor remains within a semiconductor depletion region of operation.

36. The memory of claim 35, comprising:

an access transistor coupled to said planar storage capacitor and said voltage controller to conductively couple said planar storage capacitor to said voltage controller during said write operation.

37. The memory of claim 35, wherein:

said conductive gate electrode includes p+ doped polysilicon and said semiconductor substrate is held at $V_{ss}$ during operation of said memory.

38. The memory of claim 35, wherein:

said semiconductor substrate includes an n-doped well in a region below said conductive gate electrode; and said conductive gate electrode includes p+ doped polysilicon and said n-doped well is held at $V_{ss}$ during operation of said memory.

* * * * *